US010466766B2

United States Patent
Arimilli et al.

(10) Patent No.: US 10,466,766 B2
(45) Date of Patent: Nov. 5, 2019

(54) GROUPING CENTRAL PROCESSING UNIT MEMORIES BASED ON DYNAMIC CLOCK AND VOLTAGE SCALING TIMING TO IMPROVE DYNAMIC/LEAKAGE POWER USING ARRAY POWER MULTIPLEXERS

(71) Applicant: QUALCOMM Incorporated, San Diego, CA (US)

(72) Inventors: Rajesh Arimilli, Bangalore (IN); Bharat Kumar Rangarajan, Bangalore (IN); Rakesh Misra, Bangalore (IN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/808,538

(22) Filed: Nov. 9, 2017

(65) Prior Publication Data

US 2019/0138079 A1    May 9, 2019

(51) Int. Cl.
*G11C 5/14* (2006.01)
*G06F 1/3234* (2019.01)
(Continued)

(52) U.S. Cl.
CPC .......... *G06F 1/3275* (2013.01); *G06F 1/3206* (2013.01); *G06F 1/3287* (2013.01);
(Continued)

(58) Field of Classification Search
CPC .... G06F 1/3275; G06F 1/3206; G06F 1/3287; G06F 13/4273; G11C 5/147; G11C 11/419; G09G 2330/02
(Continued)

(56) References Cited

U.S. PATENT DOCUMENTS 7,903,483 B2    3/2011  Russell et al.
9,069,664 B2    6/2015  Dally
(Continued)

FOREIGN PATENT DOCUMENTS

WO    2017034714 A1    3/2017

OTHER PUBLICATIONS

Conos N.A., et al., "Coordinated and Adaptive Power Gating and Dynamic Voltage Scaling for Energy Minimization", 2014 IEEE 25th International Conference on Application-Specific Systems, Architectures and Processors, IEEE, Jun. 18, 2014, XP032626204, DOI: 10.1109/ASAP.2014.6868643 [retrieved on Jul. 30, 2014], pp. 100-107.
(Continued)

*Primary Examiner* — Viet Q Nguyen
(74) *Attorney, Agent, or Firm* — Loza & Loza, LLP (57) ABSTRACT

Systems, methods, and apparatus for operating a central processing unit (CPU) are provided. The CPU includes a plurality of memories including a first group of memories and a second group of memories. The plurality of memories are grouped based on a timing criticality of each memory. The CPU further includes a memory core (MX) voltage supply configured to provide the plurality of memories with an MX voltage, an application processor core (APC) voltage supply configured to provide the plurality of memories with an APC voltage, and a voltage switching circuit. The voltage switching circuit detects an operating mode of the CPU and switches a voltage provided to at least one of the first group of memories or the second group of memories between the MX voltage and the APC voltage based on a type of the operating mode detected.

27 Claims, 7 Drawing Sheets

(51) Int. Cl.
  *G06F 1/3287* (2019.01)
  *G11C 11/419* (2006.01)
  *G06F 13/42* (2006.01)
  *G06F 1/3206* (2019.01)

(52) U.S. Cl.
  CPC .......... *G06F 13/4273* (2013.01); *G11C 5/147* (2013.01); *G11C 11/419* (2013.01); *G09G 2330/02* (2013.01)

(58) Field of Classification Search
  USPC .................................................. 365/227, 228
  See application file for complete search history.

(56) References Cited

U.S. PATENT DOCUMENTS

| | | | |
|---|---|---|---|
| 9,620,178 B1* | 4/2017 | Masakawa | G11C 11/4072 |
| 9,671,855 B2 | 6/2017 | Grunzke et al. | |
| 9,690,359 B2* | 6/2017 | Cao | G06F 1/3275 |
| 9,886,081 B2* | 2/2018 | Banerjee | G06F 1/3287 |
| 10,248,558 B2* | 4/2019 | Rangarajan | G06F 12/0238 |
| 2006/0186211 A1* | 8/2006 | Kim | G06K 7/0021 |
| | | | 235/492 |
| 2009/0045679 A1* | 2/2009 | Kuzmenka | G11C 5/147 |
| | | | 307/48 |
| 2009/0190428 A1* | 7/2009 | Kato | G11C 5/141 |
| | | | 365/228 |
| 2010/0128535 A1* | 5/2010 | Takahashi | G11C 16/0433 |
| | | | 365/185.23 |
| 2010/0149884 A1* | 6/2010 | Kumar | G11C 5/147 |
| | | | 365/189.09 |
| 2015/0170736 A1* | 6/2015 | Gulati | G11C 11/417 |
| | | | 365/154 |
| 2015/0198988 A1* | 7/2015 | Dasnurkar | G06F 1/324 |
| | | | 702/64 |
| 2015/0363116 A1* | 12/2015 | Govindan | G06F 1/3225 |
| | | | 713/320 |
| 2016/0109932 A1* | 4/2016 | Jeon | G06F 1/3296 |
| | | | 713/323 |
| 2016/0111134 A1* | 4/2016 | Kim | G11C 5/147 |
| | | | 365/226 |
| 2016/0132097 A1* | 5/2016 | Gainey | G06F 1/32 |
| | | | 713/323 |
| 2016/0179156 A1* | 6/2016 | Eastep | G06F 1/324 |
| | | | 713/300 |
| 2016/0231795 A1 | 8/2016 | Dressler et al. | |
| 2017/0060224 A1* | 3/2017 | Cao | G06F 1/3275 |
| 2017/0090539 A1 | 3/2017 | Tiwari et al. | |
| 2017/0199558 A1 | 7/2017 | Farazmand et al. | |
| 2017/0351315 A1* | 12/2017 | Ochoa Munoz | G06F 1/324 |
| 2019/0065359 A1* | 2/2019 | Rangarajan | G06F 12/0238 |

OTHER PUBLICATIONS

Craig K., et al., "A 32 b 90 nm Processor Implementing Panoptic DVS Achieving Energy Efficient Operation From Sub-Threshold to High Performance", IEEE Journal of Solid-state Circuits, IEEE Service Center, Piscataway, NJ, USA, vol. 49, No. 2, Feb. 1, 2014, XP011538062, ISSN: 0018-9200, DOI: 10,1109/J9SSC.2013. 2285384 [retrieved on Jan. 24, 2014], pp. 545-552.

Dreslinski R.G., et al., "Reconfigurable Energy Efficient Near Threshold Cache Architectures", Microarchitecture, 2008. MICRO-41, 2008 41ST IEEE/ACM International Symposium on, IEEE, Piscataway, NJ, USA, Nov. 8, 2008, XP058088579, DOI: 10.1109/MICR0.2008.4771813, ISBN: 978-1-4244-2836-6, pp. 459-470.

International Search Report and Written Opinion—PCT/US2018/052231—ISA/EPO—Dec, 14, 2018.

Miller T.N., et al., "Booster: Reactive Core Acceleration for Mitigating the Effects of Process Variation and Application Imbalance in Low-Voltage Chips", High Performance Computer Architecture (HPCA), 2012 IEEE 18th International Symposium on, IEEE, Feb. 25, 2012, XP032141863, DOI: 10.1109/HPCA2012.6168942, ISBN: 978-1-4673-0827-4, pp. 1-12.

\* cited by examiner

| Memory Type | Nominal | Nominal L1 | Turbo |
|---|---|---|---|
| btac_rams | Nom(1.0V) | Nom_L1(1.2V) | Turbo(1.5V) |
| l1d_datarams | Nom(1.0V) | Nom_L1(1.2V) | Turbo(1.5V) |
| l1d_dirty_rams | Nom(1.0V) | Nom_L1(1.2V) | Turbo(1.5V) |
| l1d_tagram | Nom(1.0V) | Nom_L1(1.2V) | Turbo(1.5V) |
| l1i_datarams | Nom(1.0V) | Nom_L1(1.2V) | Turbo(1.5V) |
| l2_datarams | Nom(1.0V) | Nom(1.0V) | Turbo(1.5V) |
| l2_tagrams | Nom(1.0V) | Nom_L1(1.2V) | Turbo(1.5V) |
| l2_victimrams | Nom(1.0V) | Nom_L1(1.2V) | Turbo(1.5V) |

GROUPING CENTRAL PROCESSING UNIT MEMORIES BASED ON DYNAMIC CLOCK AND VOLTAGE SCALING TIMING TO IMPROVE DYNAMIC/LEAKAGE POWER USING ARRAY POWER MULTIPLEXERS

TECHNICAL FIELD

The present disclosure relates generally to an apparatus operating a central processing unit (CPU) and, more particularly, to optimizing power use of CPU memories.

BACKGROUND

Semiconductor apparatuses, such as integrated circuits, are constructed from electronic components formed on semiconductor materials and interconnected with circuit wiring. A network of these circuit wirings may connect to memories of a CPU subsystem (CPUSS) and provide the CPUSS memories with power at a particular voltage level.

CPU products may have very high performance requirements including a frequency at which CPU cores run. For example, the frequency requirements of one type of CPU (e.g., gold CPU) may be over 2.5 GHz in a turbo mode, wherein the turbo mode is a high-performance mode requiring a higher operating voltage. In another example, the frequency requirements of another type of CPU (e.g., silver CPU) may typically be around 2 GHz in the turbo mode.

CPUSS memories typically operate at a normal frequency and voltage level when operating in a nominal mode using a voltage provided from a memory core (MX) voltage supply (or VDD_MX). In turbo mode use cases (or other faster operating mode use cases), the CPUSS memories may operate at a highest possible frequency and voltage level for a particular chip, wherein the VDD_MX may be chosen to supply the turbo mode voltage. Notably, the VDD_MX is a voltage rail common to several or all components of an entire chip. Therefore, increasing the voltage provided from the VDD_MX in the turbo mode may unnecessarily impact the power supplied to other chip components while only intending to affect the CPUSS memories.

Accordingly, what is needed is a novel approach for increasing a voltage supplied to the CPUSS memories for a faster operating mode that optimizes power use.

SUMMARY

Certain aspects of the disclosure relate to systems, apparatus, methods and techniques for operating a central processing circuit or a central processing unit (CPU).

In various aspects of the disclosure, an apparatus includes a central processing circuit or CPU. The apparatus may further include one of a cellular phone and a mobile computing device incorporating the central processing circuit or CPU. The central processing circuit or CPU includes a plurality of memory devices including a first group of memory devices and a second group of memory devices, a memory core (MX) voltage supply configured to provide the plurality of memory devices with an MX voltage, an application processor core (APC) voltage supply configured to provide the plurality of memory devices with an APC voltage, and a voltage switching circuit configured to detect an operating mode of the central processing circuit or CPU and switch a voltage provided to at least one of the first group of memory devices or the second group of memory devices between the MX voltage and the APC voltage based on a type of the operating mode detected.

In an aspect, the plurality of memory devices are grouped based on a timing criticality of each of the plurality of memory devices, wherein the first group of memory devices includes memory devices that are timing critical (e.g., timing criticality less than or equal to a timing threshold) and the second group of memory devices includes memory devices that are not timing critical (e.g., timing criticality greater than the timing threshold).

In an aspect, the voltage switching circuit is configured to switch the first group of memory devices from the MX voltage to the APC voltage when the operating mode is faster than a nominal operating mode (e.g., at least a nominal L1 operating mode). The nominal L1 operating mode may be an intermediate dynamic clock and voltage scaling (DCVS) operating mode between a nominal operating mode and a turbo operating mode. In a further aspect, the voltage switching circuit is configured to switch the second group of memory devices from the MX voltage to the APC voltage when the operating mode is at least the turbo operating mode.

In an aspect, the voltage switching circuit includes a first array power multiplexer (APM) coupled to the first group of memory devices and configured to switch the voltage provided to the first group of memory devices between the MX voltage and the APC voltage, and a second array power multiplexer (APM) coupled to the second group of memory devices and configured to switch the voltage provided to the second group of memory devices between the MX voltage and the APC voltage. The voltage switching circuit further includes a first APM controller for controlling the first APM, a second APM controller for controlling the second APM, and a dynamic clock and voltage scaling (DCVS) circuit for controlling the first APM controller and the second APM controller.

In an aspect, the DCVS circuit is configured to detect the operating mode, initiate the first APM controller to control the first APM to switch the voltage supplied to the first group of memory devices from the MX voltage to the APC voltage when the operating mode is faster than a nominal operating mode (e.g., at least a nominal L1 operating mode), and initiate the second APM controller to control the second APM to switch the voltage supplied to the second group of memory devices from the MX voltage to the APC voltage when the operating mode is at least a turbo operating mode.

In various aspects of the disclosure, a method of operating a central processing circuit or a central processing unit (CPU) includes supplying a plurality of memory devices with at least one of a memory core (MX) voltage or an application processor core (APC) voltage, wherein the plurality of memory devices includes a first group of memory devices and a second group of memory devices, detecting an operating mode of the central processing circuit or CPU, and switching a voltage supplied to at least one of the first group of memory devices or the second group of memory devices between the MX voltage and the APC voltage based on a type of the operating mode detected.

The plurality of memory devices may be grouped based on a timing criticality of each of the plurality of memory devices, wherein the first group of memory devices includes memory devices that are timing critical and the second group of memory devices includes memory devices that are not timing critical.

In an aspect, the first group of memory devices is switched from the MX voltage to the APC voltage when the operating mode is faster than a nominal operating mode (e.g., at least a nominal L1 operating mode). In another aspect, the second group of memory devices is switched from the MX voltage to the APC voltage when the operating mode is at least a turbo operating mode.

In various aspects of the disclosure, an apparatus for operating a central processing circuit or a central processing unit (CPU), includes means for supplying a plurality of memory devices with at least one of a memory core (MX) voltage or an application processor core (APC) voltage, wherein the plurality of memory devices includes a first group of memory devices and a second group of memory devices, means for detecting an operating mode of the central processing circuit or CPU, and means for switching a voltage supplied to at least one of the first group of memory devices or the second group of memory devices between the MX voltage and the APC voltage based on a type of the operating mode detected.

The apparatus further includes means for grouping the plurality of memory devices based on a timing criticality of each of the plurality of memory devices, wherein the first group of memory devices includes memory devices that are timing critical and the second group of memory devices includes memory devices that are not timing critical.

In an aspect, the means for switching is configured to switch the first group of memory devices from the MX voltage to the APC voltage when the operating mode is faster than a nominal operating mode (e.g., at least a nominal L1 operating mode). In another aspect, the means for switching is configured to switch the second group of memory devices from the MX voltage to the APC voltage when the operating mode is at least a turbo operating mode.

In an aspect, the means for switching includes a first array power multiplexer (APM) means for switching the voltage provided to the first group of memory devices between the MX voltage and the APC voltage, and a second APM means for switching the voltage provided to the second group of memory devices between the MX voltage and the APC voltage. The means for switching further includes a first APM controlling means for controlling the first APM means, a second APM controlling means for controlling the second APM means, and a dynamic clock and voltage scaling (DCVS) means for controlling the first APM controlling means and the second APM controlling means.

In an aspect, the DCVS means is configured to detect the operating mode, initiate the first APM controlling means to control the first APM means to switch the voltage supplied to the first group of memory devices from the MX voltage to the APC voltage when the operating mode is faster than a nominal operating mode (e.g., at least a nominal L1 operating mode), and initiate the second APM controlling means to control the second APM means to switch the voltage supplied to the second group of memory devices from the MX voltage to the APC voltage when the operating mode is at least a turbo operating mode.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Figure 1:
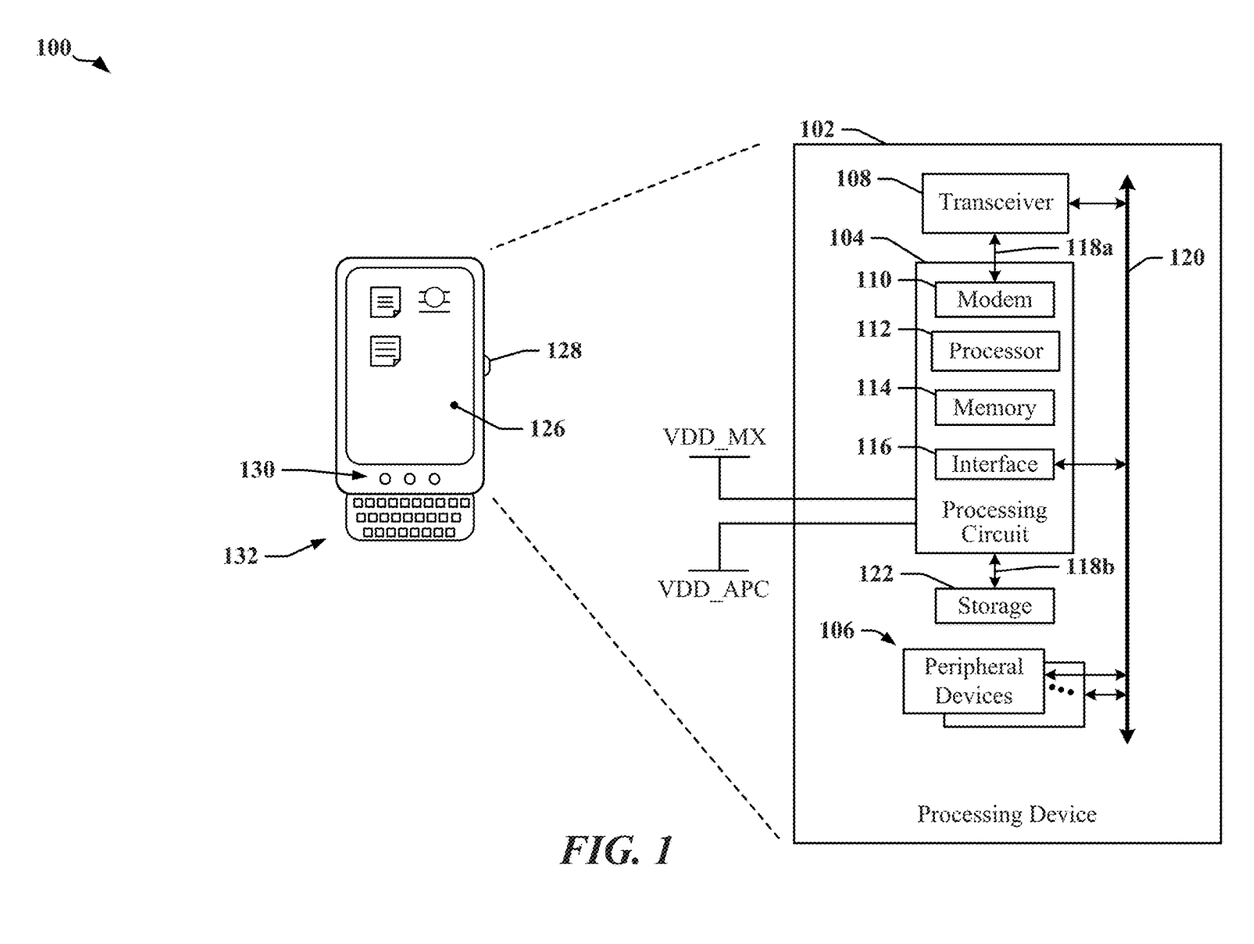
FIG. 1 illustrates an example of an apparatus that may employ a data communication bus.

According to certain aspects, a central processing circuit including, for example, a central processing unit subsystem (CPUSS), a central processing unit (CPU) cluster, and memories of the central processing circuit may be implemented in an apparatus 100 such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, a mobile computing device, or any other similar functioning device.

FIG. 1 illustrates an example of an apparatus 100 that may employ a data communication bus. The apparatus 100 may include a processing device 102 having multiple circuits or devices 104, 106, and/or 108, which may be implemented in one or more application-specific integrated circuits (ASICs) or in a SoC. In one example, the apparatus 100 may be a communication device and the processing device 102 may include an ASIC or processing circuit 104, one or more peripheral devices 106, and a transceiver 108 that enables the apparatus to communicate with a radio access network, a core access network, the Internet, and/or another network. The apparatus 100 may include, for example, a cell phone and/or a mobile computing device (such as a laptop, an Internet of Things (IoT) device, or a vehicle). According to certain aspects of the present disclosure, the "central processing circuit" or "CPU" described infra may correspond to the processing circuit 104. Moreover, a memory core (MX) voltage supply (VDD_MX) may provide various modules and/or circuits of the processing circuit 104 with an MX voltage and an application processor core (APC) voltage supply (VDD_APC) may provide the various modules and/or circuits of the processing circuit 104 with an APC voltage.

The ASIC or processing circuit 104 may have one or more processors 112, one or more modems 110, on-board memory 114, a bus interface circuit 116, and/or other logic circuits or functions. The processing device 102 may be controlled by an operating system that may provide an application programming interface (API) layer that enables the one or more processors 112 to execute software modules residing in the on-board memory 114 or other processor-readable storage 122 provided on the processing device 102. The software modules may include instructions and data stored in the on-board memory 114 or processor-readable storage 122. The ASIC or processing circuit 104 may access its on-board memory 114, the processor-readable storage 122, and/or storage external to the processing device 102. The on-board memory 114 may include read-only memory (ROM) or random-access memory (RAM), electrically erasable programmable ROM (EEPROM), flash cards, or any memory device that can be used in processing systems and computing platforms. The processing device 102 may include, implement, or have access to a local database or other parameter storage that can maintain operational parameters and other information used to configure and operate the apparatus 100 and/or the processing device 102. The local database may be implemented using registers, a database module, flash memory, magnetic media, EEPROM, soft or hard disk, or the like. The processing device 102 may also be operably coupled to external devices such as a display 126, operator controls, such as switches or buttons 128, 130, and/or an integrated or external keypad 132, among other components. A user interface module may be configured to operate with the display 126, keypad 132, etc. through a dedicated communication link or through one or more serial data interconnects.

The processing device 102 may provide one or more buses 118a, 118b, 120 that enable certain devices 104, 106, and/or 108 to communicate. In one example, the ASIC or processing circuit 104 may include a bus interface circuit 116 that includes a combination of circuits, counters, timers, control logic, and other configurable circuits or modules. In one example, the bus interface circuit 116 may be configured to operate in accordance with communication specifications or protocols. The processing device 102 may include or control a power management function that configures and manages the operation of the apparatus 100.

Aspects of the present disclosure relate to optimizing a power supplied to memories of a central processing circuit for a faster/higher operating mode (e.g., turbo mode or nominal L1 mode and higher) while mitigating any unnecessary impact an increased voltage will have on other chip components. A novel approach may include providing an array power multiplexer (APM) between an application processor core (APC) voltage supply (or VDD_APC) and a memory core (MX) voltage supply (or VDD_MX) in the central processing circuit to switch the voltage supplied to the memories from the VDD_MX to the VDD_APC in faster operating mode cases.

When an application running in a particular central processing circuit requires a higher workload, a shift to the turbo mode (or other faster operating mode) may be required. In an aspect, software may identify the turbo mode requirement of the application and choose to increase the voltage provided from the application processor core (APC) voltage supply (or VDD_APC) and the memory core (MX) voltage supply (or VDD_MX) corresponding to the turbo mode. In some instances, the VDD_MX voltage may be a minimum voltage supplied to a memory for operating the memory properly and/or retaining stored data within the memory. The VDD_APC voltage may be, for example, a voltage supplied to only a central processing circuit or CPU prior to this disclosure for operating the central processing circuit or CPU. In particular, the software may send power management integrated circuit (PMIC) commands/requests to ramp up the voltage to turbo mode requirements for both the VDD_APC and the VDD_MX. Moreover, corresponding phase-locked loops (PLLs)/clock control and are programmed to generate turbo frequencies once the VDD_APC and VDD_MX rails are ramped up to the desired turbo voltage.

However, as previously mentioned, the VDD_MX is a voltage rail common to several or all components of an entire chip. For example, the VDD_MX voltage supply may be shared among any or all of the, for example, modem, digital signal processor (DSP), graphics processing unit (GPU), etc. As such, allowing the software to increase the voltage provided from the VDD_MX may be disadvantageous since the increased voltage is unnecessarily supplied to the several or all other chip components, thus negatively impacting power efficiency and causing a device battery to drain more quickly. Days of Use (DoU) cases (e.g., gaming applications, Internet applications, etc.) may also be impacted due to the power penalty.

Moreover, having the software manage a dynamic clock and voltage scaling (DCVS) functionality to change a voltage and clock may not be optimal, resulting in increased latency. For example, in order for the software to command the increase of the voltage provided from the VDD_APC and/or the VDD_MX, software command signals may have to travel through a number of buses and/or undergo a number of configurations before finally inducing the voltage supply increase. Such procedure may span many clock cycles. As such, DCVS latency is negatively affected due to the number of clock cycles necessary for the software to prompt the voltage change.

Figure 2:
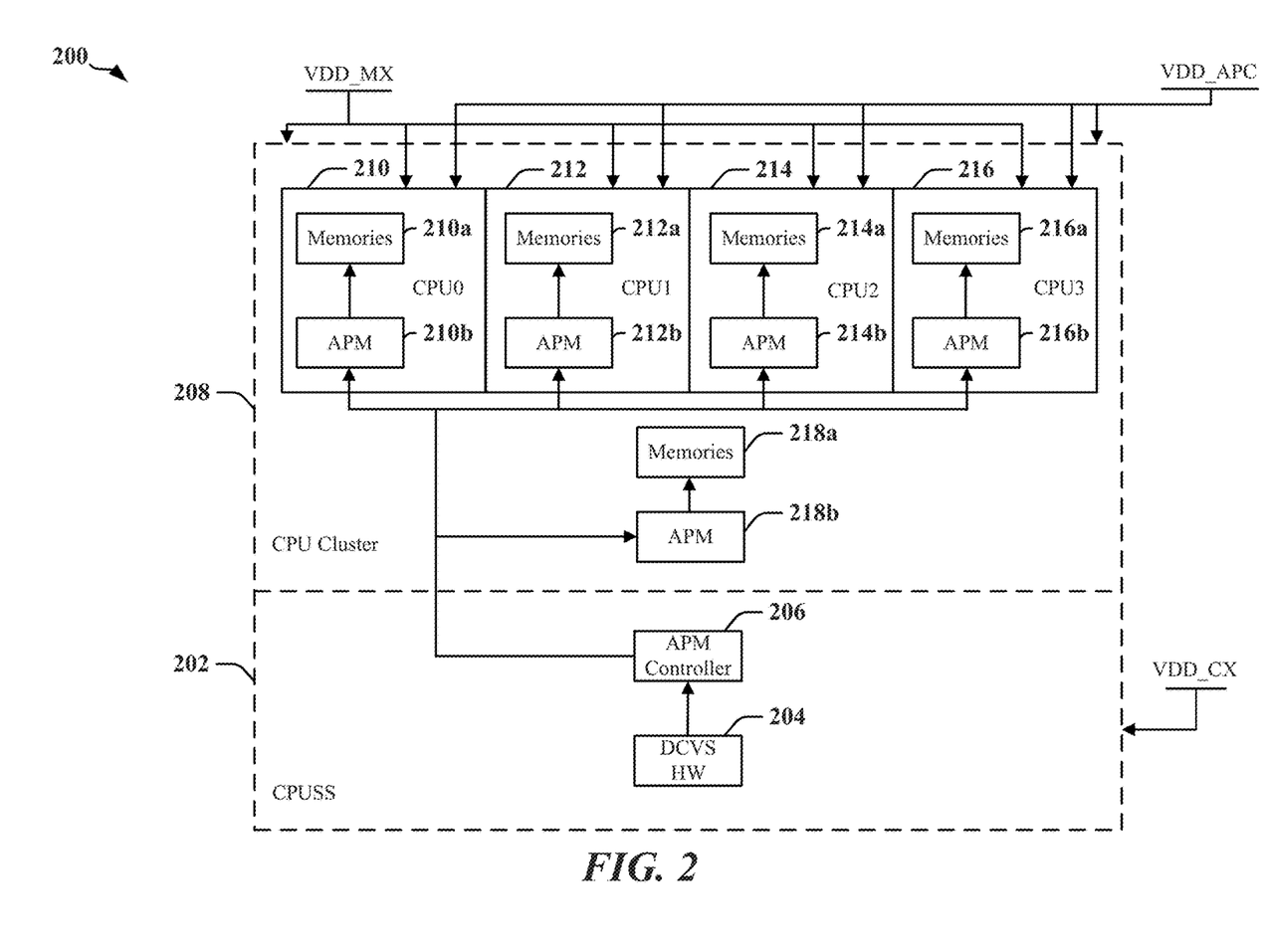
FIG. 2 is a diagram illustrating an example of a CPU architecture.

FIG. 2 is a diagram illustrating an example of a CPU architecture 200. The CPU architecture 200 may include a CPU subsystem (CPUSS) 202 and a CPU cluster 208. The CPUSS 202 may include a DCVS hardware module/circuit 204 and an array power multiplexer (APM) controller 206. The CPU cluster 208 may include a number of CPUs (or CPU cores), such as a CPU0 210, a CPU1 212, a CPU2 214, and a CPU3 216. Each CPU may include various memories (e.g., L1 and/or L2 memories) coupled to an APM. As shown in FIG. 2, the CPU0 210 includes memories 210a coupled to an APM 210b, the CPU1 212 includes memories 212a coupled to an APM 212b, the CPU2 214 includes memories 214a coupled to an APM 214b, and the CPU3 216 includes memories 216a coupled to an APM 216b. The CPU cluster 208 may also include memories 218a (e.g., L3 memories) coupled to an APM 218b that are external to the CPUs.

In an aspect, the DCVS hardware module/circuit 204 and the APM controller 206 are configured to operate according to a chip core (CX) voltage provided by a chip core voltage supply (VDD_CX). The APMs 210b, 212b, 214b, 216b, and 218b are configured to operate according to an application processor core (APC) voltage provided by an application processor core voltage supply (VDD_APC). The memories 210a, 212a, 214a, 216a, and 218a may be configured to operate according to a memory core (MX) voltage provided by a memory core voltage supply (VDD_MX) or the APC voltage provided by the VDD_APC based on an operating mode required by an application. For example, the memories 210a, 212a, 214a, 216a, and 218a may operate according to the MX voltage under a nominal operating mode and may operate according to the APC voltage under a faster operating mode (e.g., turbo mode or nominal L1 mode and higher). Notably, the nominal L1 operating mode may be an intermediate DCVS operating mode between the nominal operating mode and the turbo operating mode.

In an aspect, the DCVS hardware module/circuit 204 (which may be referred to as an operating state manager (OSM)) is provided to manage DCVS functionality and improves an overall DCVS latency as compared to the software described above. When an application requires a higher workload, thus necessitating a faster operating mode, the DCVS hardware module/circuit 204 may be triggered to switch, causing the APM controller 206 to send a signal to the APMs 210b, 212b, 214b, 216b, and 218b to switch the voltage respectively supplied to the memories 210a, 212a, 214a, 216a, and 218a from the MX voltage to the APC voltage to facilitate the faster operating mode (e.g., turbo mode or nominal L1 mode and higher). When the faster operating mode is no longer required, the DCVS hardware module/circuit 204 may be triggered to switch again, causing the APM controller 206 to send a signal to the APMs 210b, 212b, 214b, 216b, and 218b to switch the voltage respectively supplied to the memories 210a, 212a, 214a, 216a, and 218a back from the APC voltage to the MX voltage to facilitate a nominal operating mode.

In an aspect, the CPU architecture 200 is advantageous in that the VDD_MX is managed by an APM (e.g., APMs 210b, 212b, 214b, 216b, and 218b). Although the VDD_MX is common to several or all components of an entire chip, no power increase is unnecessarily supplied to chip components other than the memories 210a, 212a, 214a, 216a, and 218a because the voltage supplied from the VDD_MX is not increased when an application requires the faster operating mode. Rather, the voltage supplied to the memories 210a, 212a, 214a, 216a, and 218a is switched to the VDD_APC for the faster operating mode. The VDD_APC is localized to the CPU, and therefore, no power is unnecessarily drained by other chip components (e.g., modem, digital signal processor (DSP), graphics processing unit (GPU), etc.) when the faster operating mode is enabled. This results in Days of Use (DoU) savings.

In a further aspect, the CPU architecture 200 is advantageous in that the DCVS functionality is managed by hardware. As opposed to software managing the DCVS functionality, the use of hardware eliminates a number of clock cycles necessary for software command signals to travel through a number of buses and/or undergo a number of configurations to command a switch from VDD_MX to VDD_APC or vice versa. Hence, overall latency is improved.

Figure 3:
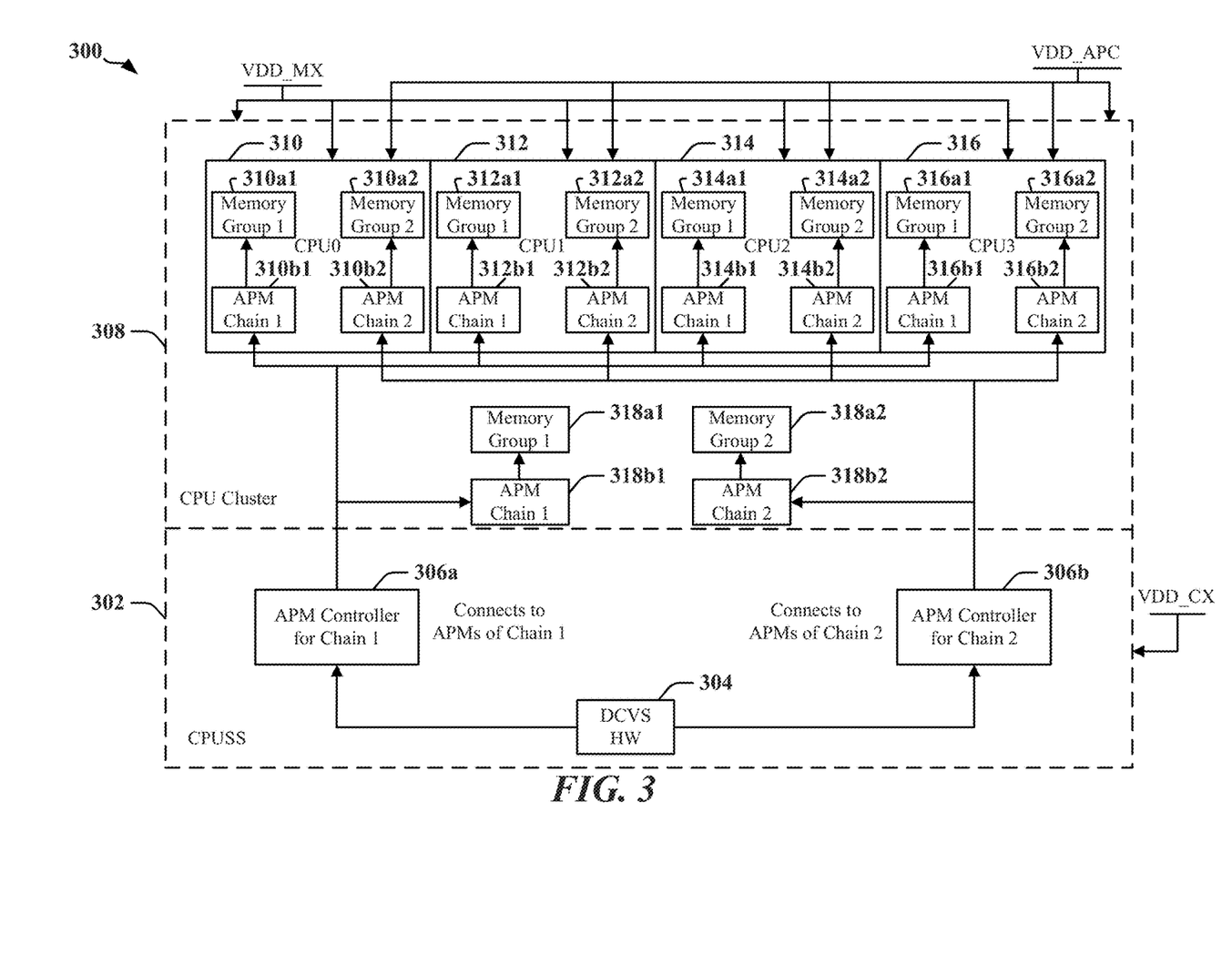
FIG. 3 is a diagram illustrating another example of a CPU architecture in accordance with certain aspects disclosed herein.

FIG. 3 is a diagram illustrating another example of a CPU architecture 300. The CPU architecture 300 may include a CPU subsystem (CPUSS) 302 and a CPU cluster 308. The CPUSS 302 may include a DCVS hardware module/circuit 304, a first APM controller 306a and a second APM controller 306b. The CPU cluster 308 may include a number of CPUs (or CPU cores), such as a CPU0 310, a CPU1 312, a CPU2 314, and a CPU3 316. Each CPU may include various memories (e.g., L1 and/or L2 memories) coupled to an APM. The CPU cluster 308 may also include various memories (e.g., L3 memories) that are external to the CPUs and coupled to an APM. In an aspect, the L1, L2, and L3 memories may be cache memories. In a further aspect, the L1, L2, and L3 cache memories may be distinguishable and/or different from a random access memory (RAM) and each of the L1, L2, and L3 cache memories may have different access speeds (e.g., faster than RAM).

In an aspect, the memories may be grouped based on a timing criticality. A first group of memories (Group 1) are timing critical as an application may need a faster access time to such memories (e.g., an access time less than or equal to a timing threshold). For example, the application may need single-cycle (one clock cycle) write/read access to the Group 1 memories. The Group 1 memories may be very close in proximity to the CPU. Moreover, the Group 1 memories may include L1 tag memories, L1 data memories, L2 tag memories, and L3 tag memories. A tag memory may store a tag address of a cache line while a data memory may store data of the cache line.

A second group of memories (Group 2) are larger in size, and therefore, may provide longer access times (e.g., an access time greater than the timing threshold). For example, the Group 2 memories may provide multi-cycle (more than one clock cycle) write/read access to an application. Also, the Group 2 memories are farther in distance from the CPU as compared to the Group 1 memories. As such, the Group 2 memories are less timing critical. The Group 2 memories may include L2 data memories and L3 data memories.

In an aspect, an independent APM controller may be provided for each memory group.

For example, a first APM chain (Chain 1) may connect all Group 1 memories and the first APM controller 306a may control all APMs associated with the Group 1 memories in the first APM chain. Similarly, a second APM chain (Chain 2) may connect all Group 2 memories and the second APM controller 306b may control all APMs associated with the Group 2 memories in the second APM chain.

As shown in FIG. 3, the CPU0 310 includes Group 1 memories (L1 tag/data memories and L2 tag memories) 310a1 coupled to an APM 310b1 of Chain 1 and Group 2 memories (L2 data memories) 310a2 coupled to an APM 310b2 of Chain 2. The CPU1 312 includes Group 1 memories 312a1 (L1 tag/data memories and L2 tag memories) coupled to an APM 312b1 of Chain 1 and Group 2 memories (L2 data memories) 312a2 coupled to an APM 312b2 of Chain 2. The CPU2 314 includes Group 1 memories (L1 tag/data memories and L2 tag memories) 314a1 coupled to an APM 314b1 of Chain 1 and Group 2 memories (L2 data memories) 314a2 coupled to an APM 314b2 of Chain 2. The CPU3 316 includes Group 1 memories (L1 tag/data memories and L2 tag memories) 316a1 coupled to an APM 316b1 of Chain 1 and Group 2 memories (L2 data memories) 316a2 coupled to an APM 316b2 of Chain 2. The CPU cluster 308 may also include Group 1 memories (L3 tag memories) 318a1 coupled to an APM 318b1 of Chain 1 and Group 2 memories (L3 data memories) 318a2 coupled to an APM 318b2 of Chain 2 that are external to the CPUs.

In an aspect, the DCVS hardware module/circuit 304, the first APM controller 306a and the second APM controller 306b are configured to operate according to a chip core (CX) voltage provided by a chip core voltage supply (VDD_CX). The APMs 310b1, 310b2, 312b1, 312b2, 314b1, 314b2, 316b1, 316b2, 318b1, and 318b2 are configured to operate according to an application processor core (APC) voltage provided by an application processor core voltage supply (VDD_APC). The Group 1 memories 310a1, 312a1, 314a1, 316a1, and 318a1 and the Group 2 memories 310a2, 312a2, 314a2, 316a2, and 318a2 may be configured to operate according to a memory core (MX) voltage provided by a memory core voltage supply (VDD_MX) or the APC voltage provided by the VDD_APC based on an operating mode required by an application. For example, the Group 1 memories 310a1, 312a1, 314a1, 316a1, and 318a1 may operate according to the MX voltage under a nominal operating mode but may be switched from VDD_MX to VDD_APC for applications requiring a CPU core to run at a nominal L1 operating mode or higher. In another example, the Group 2 memories 310a2, 312a2, 314a2, 316a2, and 318a2 may operate according to the MX voltage under the nominal operating mode and need not be switched from VDD_MX to VDD_APC when the CPU core is running at the nominal L1 operating mode, but may be switched to VDD_APC for applications requiring the CPU core to run at a turbo operating mode.

In an aspect, the DCVS hardware module/circuit 304 (or operating state manager (OSM)) is provided to manage DCVS functionality. When an application requires a higher workload, thus necessitating a faster operating mode, the DCVS hardware module/circuit 304 may be triggered to selectively switch a voltage supplied to the Group 1 memories and/or the Group 2 memories.

For example, the DCVS hardware module/circuit 304 may cause the first APM controller 306a to send a signal to the APMs 310b1, 312b1, 314b1, 316b1, and 318b1 of Chain 1 to switch the voltage respectively supplied to the Group 1 memories 310a1, 312a1, 314a1, 316a1, and 318a1 from the MX voltage to the APC voltage when the application requires a nominal L1 operating mode or higher. Notably, the DCVS hardware module/circuit 304 does not cause the second APM controller 306b to send a signal to switch the voltage supplied to the Group 2 memories when the nominal L1 operating mode is required since the Group 2 memories may continue to operate under the nominal operating mode and be supplied with the MX voltage when the CPU core is running at the nominal L1 operating mode. When the nominal L1 operating mode is no longer required, the DCVS hardware module/circuit 304 may cause the first APM controller 306a to send a signal to the APMs 310b1, 312b1, 314b1, 316b1, and 318b1 of Chain 1 to switch the voltage respectively supplied to the Group 1 memories 310a1, 312a1, 314a1, 316a1, and 318a1 back from the APC voltage to the MX voltage to facilitate a nominal operating mode.

In another example, when the application requires a turbo operating mode, the DCVS hardware module/circuit 304 may cause the first APM controller 306a to send a signal to the APMs 310b1, 312b1, 314b1, 316b1, and 318b1 of Chain 1 to switch the voltage respectively supplied to the Group 1 memories 310a1, 312a1, 314a1, 316a1, and 318a1 from the MX voltage to the APC voltage, as well as cause the second APM controller 306b to send a signal to the APMs 310b2, 312b2, 314b2, 316b2, and 318b2 of Chain 2 to switch the voltage respectively supplied to the Group 2 memories 310a2, 312a2, 314a2, 316a2, and 318a2 from the MX voltage to the APC voltage. When the turbo operating mode is no longer required, the DCVS hardware module/circuit 304 may cause the first APM controller 306a to send a signal to the APMs 310b1, 312b1, 314b1, 316b1, and 318b1 of Chain 1 to switch the voltage respectively supplied to the Group 1 memories 310a1, 312a1, 314a1, 316a1, and 318a1 back from the APC voltage to the MX voltage to facilitate a nominal operating mode, as well as cause the second APM controller 306b to send a signal to the APMs 310b2, 312b2, 314b2, 316b2, and 318b2 of Chain 2 to switch the voltage respectively supplied to the Group 2 memories 310a2, 312a2, 314a2, 316a2, and 318a2 back from the APC voltage to the MX voltage to facilitate a nominal operating mode.

Figure 4:
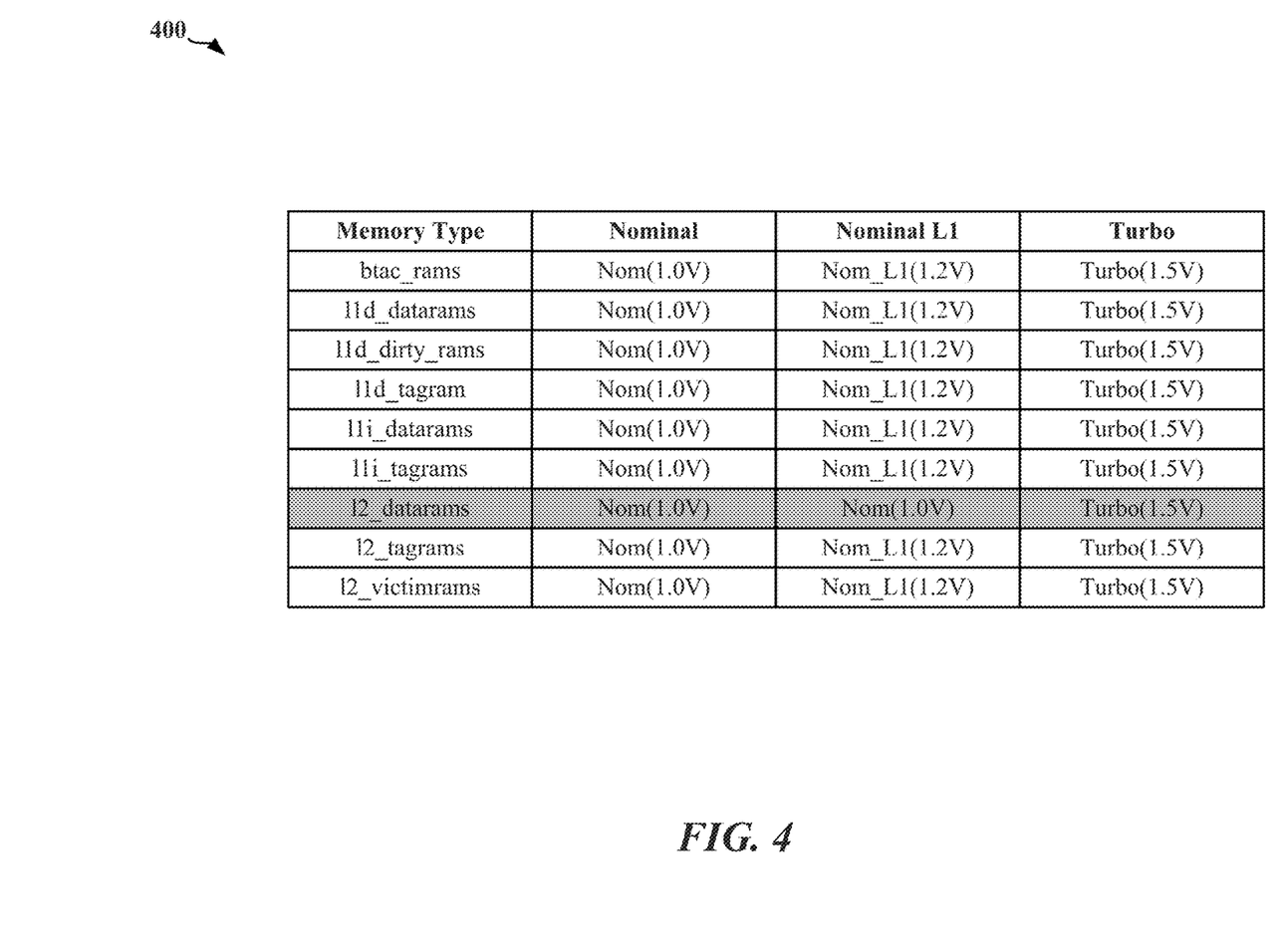
FIG. 4 is a table illustrating memory voltage requirements for different operating modes with respect to the CPU architecture of FIG. 3.

FIG. 4 is a table 400 illustrating example memory voltage requirements for different operating modes with respect to the CPU architecture 300 of FIG. 3. In particular, the example memory voltage requirements with respect to DCVS modes for CPUs are provided.

As shown in table 400, for the nominal L1 DCVS operating mode, L2 data memories/Group 2 memories (e.g., 12_datarams) may be at 1.0 V (Nom). This helps reduce memory dynamic power. The rest of the memories for the nominal L1 DCVS operating mode may be at 1.2 V (Nom_L1). For the turbo DCVS operating mode, the L2 data memories/Group 2 memories (e.g., 12_datarams) may be at 1.5 V (Turbo) (or one PMIC step up).

In an aspect of the disclosure, because two different APM chains may reside within each CPU core, two different power domains may be created. The present disclosure is applicable to all CPU cores and clusters which have turbo mode use cases and have APMs to support the same. Memories are grouped based on timing criticality. Accordingly, memories which provide multi-cycle path (MCP) write/read access will be less timing critical as compared to memories that provide single-cycle path (SCP) write/read access.

Aspects of the present disclosure are advantageous in that power savings are realized for the memories (e.g., Group 2 or L2/L3 memories) which do not switch from the VDD_MX to the VDD_APC in the nominal L1 operating mode and continue to operate in a nominal operating mode with a periphery in the nominal L1 operating mode. If the nominal operating mode is at 675 mV and the nominal L1 operating mode is at 720 mV, then an example dynamic power savings=$((720\ mV)^2-(675\ mV)^2)/(720\ mV)^2=12.1\%$ per memory instance. Example leakage power savings= $((720\ mV/675\ mV)^3-1)/(720\ mV/675\ mV)^3=17.7\%$ per memory instance. This results in large Days of Use (DoU) savings as power on VDD_APC is saved.

Figure 5:
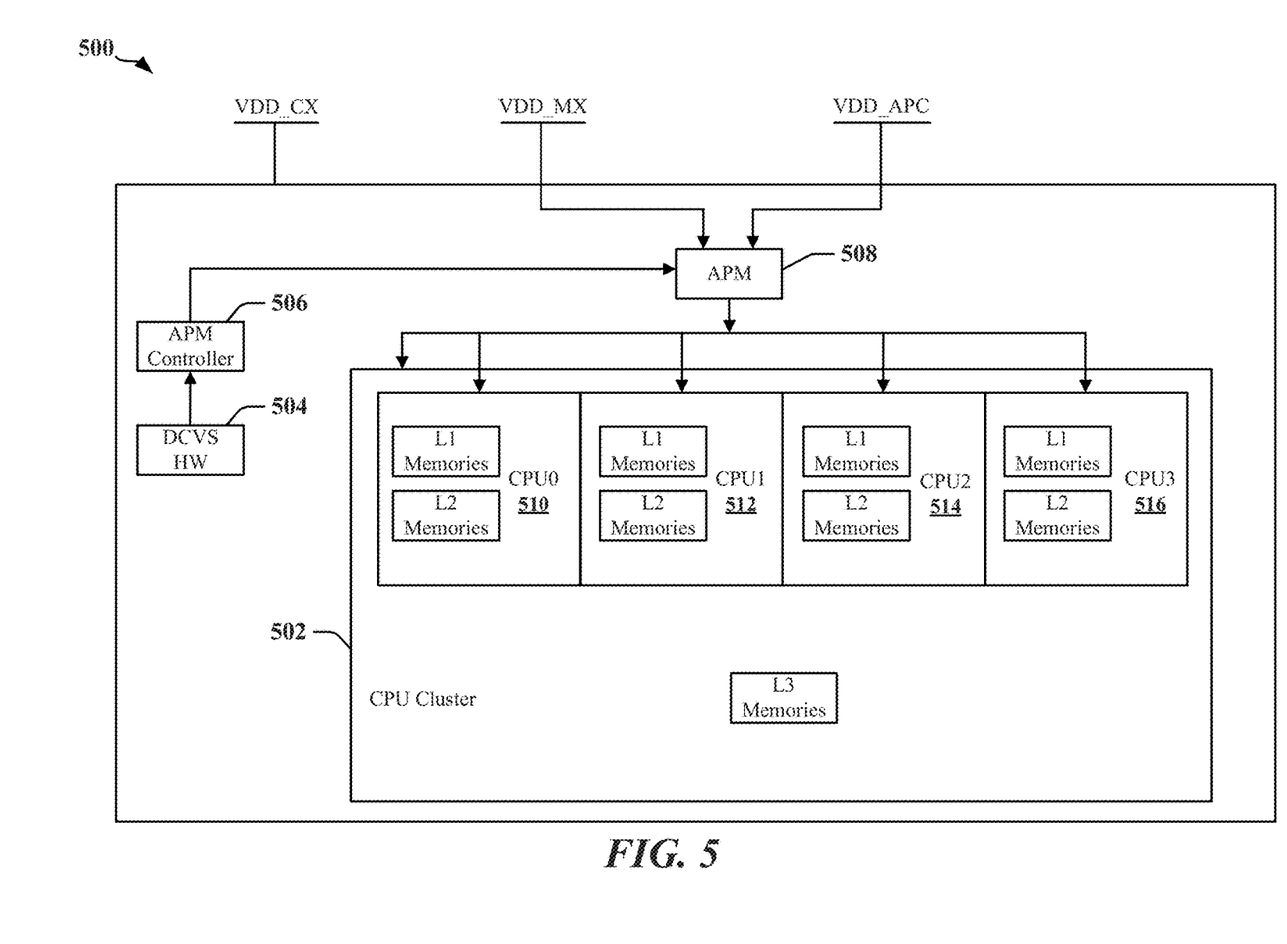
FIG. 5 is a diagram illustrating a further example of a CPU architecture in accordance with certain aspects disclosed herein.

FIG. 5 is a diagram illustrating a further example of a CPU architecture 500. The CPU architecture 500 may include a CPU cluster 502, DCVS hardware module/circuit 504, an APM controller 506, and one or more APMs 508. The CPU cluster 502 may include a number of CPUs (or CPU cores), such as a CPU0 510, a CPU1 512, a CPU2 514, and a CPU3 516. Each CPU may include various memories (e.g., L1 and/or L2 memories) coupled to a corresponding APM of the one or more APMs 508. The CPU cluster 502 may also include various memories (e.g., L3 memories) that are external to the CPUs and coupled to a corresponding APM of the one or more APMs 508.

L1 tag memories, L1 data memories, L2 tag memories, and L3 tag memories are timing critical as an application may need a faster access time (single-cycle write/read access) to such memories. Moreover, the L1 tag/data memories and the L2/L3 tag memories may be very close in proximity to the CPU.

L2 data memories and L3 data memories are larger in size, and therefore, may provide longer access times (multi-cycle write/read access) to an application. Moreover, the L2/L3 data memories are farther in distance from the CPU as compared to the L1 tag/data memories and the L2/L3 tag memories. As such, the L2/L3 data memories are less timing critical.

In an aspect, the DCVS hardware module/circuit 504 and the APM controller 506 are configured to operate according to a chip core (CX) voltage provided by a chip core voltage supply (VDD_CX). The one or more APMs 508 are configured to operate according to an application processor core (APC) voltage provided by an application processor core voltage supply (VDD_APC). The L1, L2, and L3 memories may be configured to operate according to a memory core (MX) voltage provided by a memory core voltage supply (VDD_MX) or the APC voltage provided by the VDD_APC based on an operating mode required by an application. For example, the L1 tag/data memories and the L2/L3 tag memories may operate according to the MX voltage under a nominal operating mode but have to be switched from VDD_MX to VDD_APC for applications requiring a CPU core to run at a nominal L1 operating mode or higher. In another example, the L2/L3 data memories may operate according to the MX voltage under the nominal operating mode and need not be switched from VDD_MX to VDD_APC when the CPU core is running at the nominal L1 operating mode, but have to be switched to VDD_APC for applications requiring the CPU core to run at a turbo operating mode.

In an aspect, the DCVS hardware module/circuit 504 (or operating state manager (OSM)) is provided to manage DCVS functionality. When an application requires a higher workload, thus necessitating a faster operating mode, the DCVS hardware module/circuit 504 may be triggered to selectively switch a voltage supplied to the L1 tag/data memories and the L2/L3 tag memories and/or switch a voltage supplied to the L2/L3 data memories.

For example, the DCVS hardware module/circuit 504 may cause the APM controller 506 to send a signal to the one or more APMs 508 to switch the voltage respectively supplied to the L1 tag/data memories and the L2/L3 tag memories from the MX voltage to the APC voltage when the application requires a nominal L1 operating mode or higher (e.g., the VDD_APC is provided to one or more CPUs and the L1 tag/data memories and the L2/L3 tag memories only; the VDD_APC is not supplied to other components). Notably, the DCVS hardware module/circuit 504 does not cause the APM controller 506 to send a signal to switch the voltage supplied to the L2/L3 data memories when the nominal L1 operating mode is required since the L2/L3 data memories may continue to operate under the nominal operating mode and be supplied with the MX voltage when the CPU core is running at the nominal L1 operating mode. When the nominal L1 operating mode is no longer required, the DCVS hardware module/circuit 504 may cause the APM controller 506 to send a signal to the one or more APMs 508 to switch the voltage respectively supplied to the L1 tag/data memories and the L2/L3 tag memories back from the APC voltage to the MX voltage to facilitate a nominal operating mode.

In another example, the DCVS hardware module/circuit 504 may cause the APM controller 506 to send a signal to the one or more APMs 508 to switch the voltage respectively supplied to the L1 tag/data memories and the L2/L3 tag memories as well as the L2/L3 data memories from the MX voltage to the APC voltage when the application requires a turbo operating mode. When the turbo operating mode is no longer required, the DCVS hardware module/circuit 504 may cause the APM controller 506 to send a signal to the one or more APMs 508 to switch the voltage respectively supplied to the L1 tag/data memories, the L2/L3 tag memories, and the L2/L3 data memories back from the APC voltage to the MX voltage to facilitate a nominal operating mode.

Figure 6:
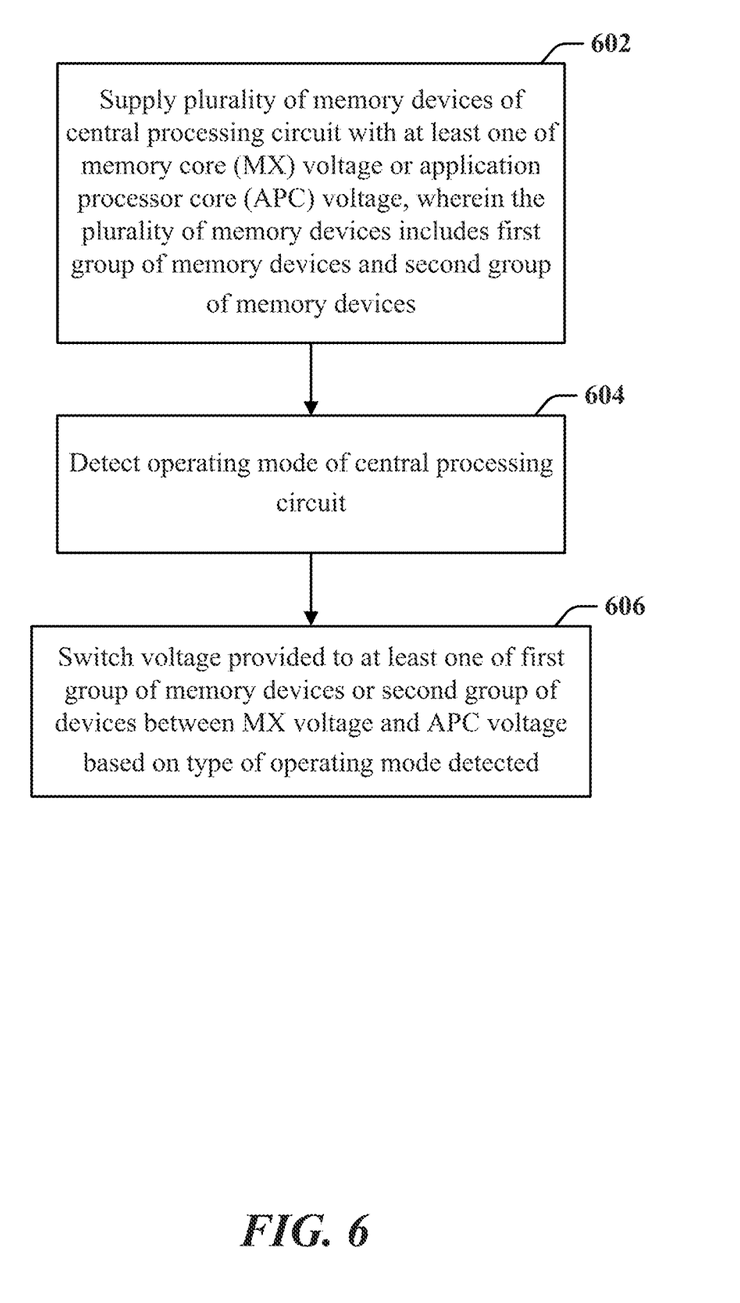
FIG. 6 is a flowchart of a method that may be performed at an apparatus for operating a central processing circuit or central processing unit (CPU) in accordance with certain aspects disclosed herein.

FIG. 6 is a flowchart 600 of a method that may be performed at an apparatus (e.g., one of a cellular phone and a mobile computing device incorporating a central processing circuit or a central processing unit (CPU)) for operating the central processing circuit or CPU.

At block 602, the apparatus may supply a plurality of memory devices of the central processing circuit with at least one of a memory core (MX) voltage or an application processor core (APC) voltage. The MX voltage may be provided from an MX voltage supply (VDD_MX) and the APC voltage may be provided from an APC voltage supply (VDD_APC).

In an aspect, the plurality of memory devices may be grouped based on a timing criticality of each of the plurality of memory devices. For example, a first group of memory devices (e.g., L1 tag/data memories, L2/L3 tag memories, or Group 1 memories 310a1, 312a1, 314a1, 316a1, and 318a1) may include memory devices that are timing critical (e.g., timing criticality less than or equal to a timing threshold or less than or equal to one clock cycle) and a second group of memory devices (e.g., L2/L3 data memories or Group 2 memories 310a2, 312a2, 314a2, 316a2, and 318a2) may include memory devices that are not timing critical (e.g., timing criticality greater than the timing threshold or greater than one clock cycle).

At block 604, the apparatus may detect an operating mode of the central processing circuit or CPU (e.g., detect an application requirement for the central processing circuit or CPU to operate at the operating mode (e.g., faster operating mode)). At block 606, the apparatus may switch a voltage supplied to at least one of the first group of memory devices or the second group of memory devices between the MX voltage and the APC voltage based on a type of the operating mode detected.

In an aspect, the first group of memory devices is switched from the MX voltage to the
APC voltage when the operating mode is faster than a nominal operating mode (e.g., at least a nominal L1 operating mode). Notably, the second group of memory devices is not switched from the MX voltage to the APC voltage when the nominal L1 operating mode is required as the second group of memory devices may continue to operate under a nominal operating mode and be supplied with the MX voltage when a central processing circuit core or CPU core is running at the nominal L1 operating mode. In another aspect, the first group of memory devices and the second group of memory devices are switched from the MX voltage to the APC voltage when the operating mode is at least a turbo operating mode.

In an aspect, the first group of memory devices is coupled to a first array power multiplexer (APM) (e.g., APMs 310b1, 312b1, 314b1, 316b1, and 318b1 or APM 508). The first APM is configured to switch the voltage provided to the first group of memory devices between the MX voltage and the APC voltage. Moreover, the second group of memory devices is coupled to a second array power multiplexer (APM) (e.g., APMs 310b2, 312b2, 314b2, 316b2, and 318b2 or APM 508). The second APM is configured to switch the voltage provided to the second group of memory devices between the MX voltage and the APC voltage.

In an aspect, the first APM is controlled by a first APM controller (e.g., first APM controller 306a or APM controller 506) and the second APM is controlled by a second APM controller (e.g., second APM controller 306b or APM controller 506). The first APM controller and the second APM controller are controlled by a dynamic clock and voltage scaling (DCVS) circuit (e.g., DCVS hardware module/circuit 304 or DCVS hardware module/circuit 504). The DCVS circuit is configured to detect the operating mode and initiate the first APM controller to control the first APM to switch the voltage supplied to the first group of memory devices from the MX voltage to the APC voltage when the operating mode is faster than a nominal operating mode (e.g., at least a nominal L1 operating mode). Notably, the DCVS circuit does not initiate the second APM controller to control the second APM to switch the voltage supplied to the second group of memory devices when the nominal L1 operating mode is detected as the second group of memory devices may continue to operate under a nominal operating mode and be supplied with the MX voltage when a central processing circuit or CPU core is running at the nominal L1 operating mode. When the operating mode is at least a turbo operating mode, the DCVS circuit is further configured to initiate the first APM controller to control the first APM to switch the voltage supplied to the first group of memory devices from the MX voltage to the APC voltage as well as initiate the second APM controller to control the second APM to switch the voltage supplied to the second group of memory devices from the MX voltage to the APC voltage.

Figure 7:
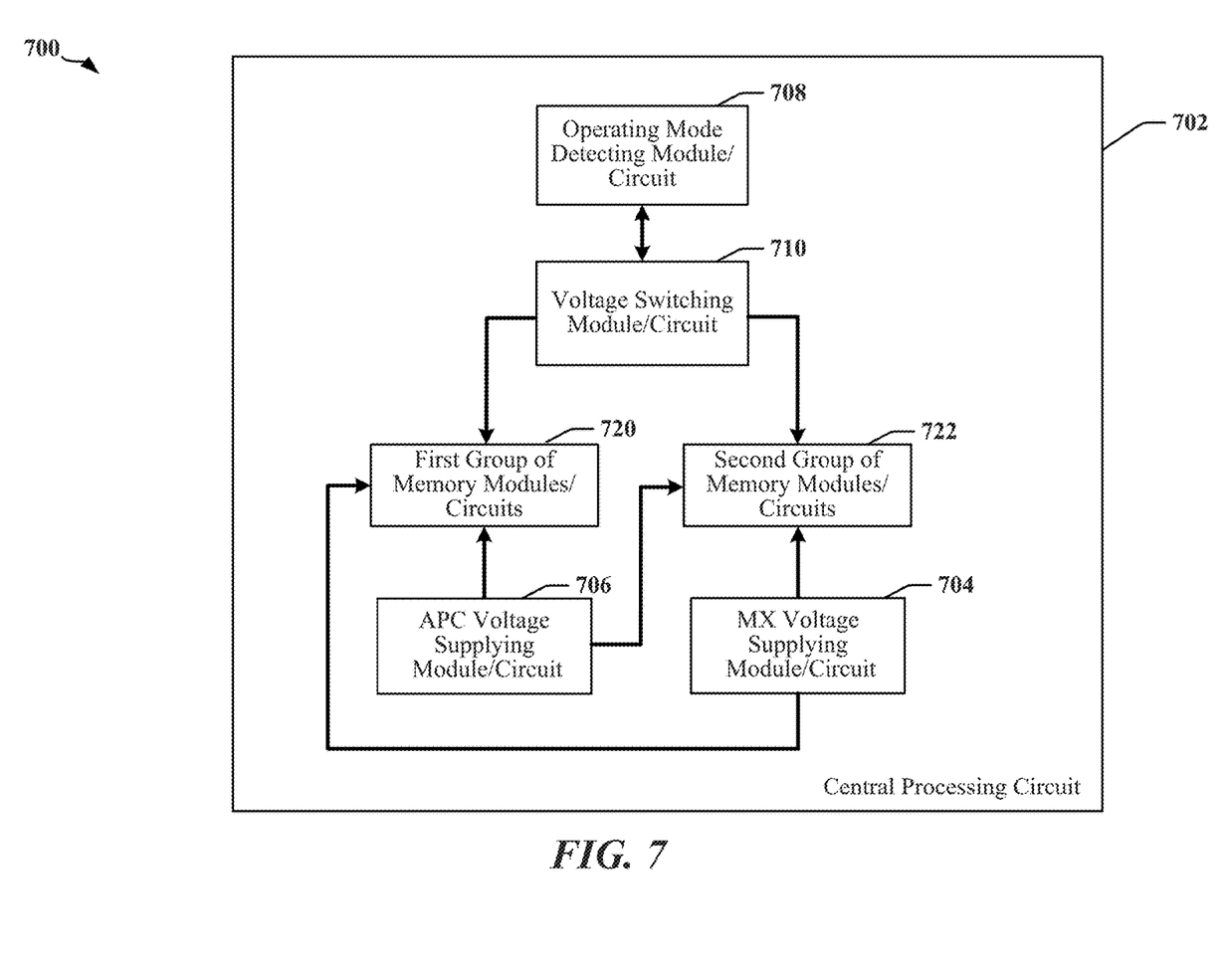
FIG. 7 illustrates an example of a hardware implementation for a central processing circuit adapted in accordance with certain aspects disclosed herein.

FIG. 7 is a diagram illustrating an example of a hardware implementation for a central processing circuit 702. The central processing circuit 702 may implement various circuits or modules including a memory core (MX) voltage supplying module/circuit 704, an application processor core (APC) voltage supplying module/circuit 706, an operating mode detecting module/circuit 708, a voltage switching module/circuit 710, a first group of memory modules/circuits 720, and a second group of memory modules/circuits 722.

The central processing circuit 702 may perform various functions described supra (e.g., the functions described with respect to FIG. 6). For example, MX voltage supplying module/circuit 704 may be configured to supply the first group of memory modules/circuits 720 and the second group of memory modules/circuits 722 with an MX voltage. The APC voltage supplying module/circuit 706 may be configured to supply the first group of memory modules/circuits 720 and the second group of memory modules/circuits 722 with an APC voltage. The operating mode detecting module/circuit 708 may be configured to detect an operating mode of the central processing circuit 702 (e.g., detect an application requirement for the central processing circuit 702 to operate at the operating mode (e.g., faster operating mode)). The voltage switching module/circuit 710 may be configured to switch a voltage supplied to at least one of the first group of memory modules/circuits 720 or the second group of memory modules/circuits 722 between the MX voltage and the APC voltage based on a type of the operating mode detected by the operating mode detecting module/circuit 708.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The invention claimed is:

1. An apparatus, comprising:
   a central processing circuit, wherein the central processing circuit includes:
   a plurality of memory devices including a first group of memory devices and a second group of memory devices, wherein the plurality of memory devices are grouped based on an access speed of each of the plurality of memory devices;
   a memory core (MX) voltage supply configured to provide the plurality of memory devices with an MX voltage;
   an application processor core (APC) voltage supply configured to provide the plurality of memory devices with an APC voltage; and
   a voltage switching circuit configured to:
   detect an operating mode of the central processing circuit, and
   switch a voltage provided to at least one of the first group of memory devices or the second group of memory devices between the MX voltage and the APC voltage based on a type of the operating mode detected.

2. The apparatus of claim 1, wherein the first group of memory devices includes memory devices that have an access speed of less than or equal to a timing threshold and the second group of memory devices includes memory devices that have an access speed of greater than the timing threshold.

3. The apparatus of claim 1, wherein the voltage switching circuit is configured to switch the first group of memory devices from the MX voltage to the APC voltage when the operating mode is faster than a nominal operating mode.

4. The apparatus of claim 1, wherein the voltage switching circuit is configured to switch the second group of memory devices from the MX voltage to the APC voltage when the operating mode is at least a turbo operating mode.

5. The apparatus of claim 1, wherein the voltage switching circuit includes:
   a first array power multiplexer (APM) coupled to the first group of memory devices and configured to switch the voltage provided to the first group of memory devices between the MX voltage and the APC voltage; and
   a second array power multiplexer (APM) coupled to the second group of memory devices and configured to switch the voltage provided to the second group of memory devices between the MX voltage and the APC voltage.

6. The apparatus of claim 5, wherein the voltage switching circuit includes:
   a first APM controller for controlling the first APM;
   a second APM controller for controlling the second APM; and a dynamic clock and voltage scaling (DCVS) circuit for controlling the first APM controller and the second APM controller.

7. The apparatus of claim 6, wherein the DCVS circuit is configured to:
detect the operating mode; and
initiate the first APM controller to control the first APM to switch the voltage supplied to the first group of memory devices from the MX voltage to the APC voltage when the operating mode is faster than a nominal operating mode.

8. The apparatus of claim 7, wherein the DCVS circuit is further configured to:
initiate the second APM controller to control the second APM to switch the voltage supplied to the second group of memory devices from the MX voltage to the APC voltage when the operating mode is at least a turbo operating mode.

9. The apparatus of claim 1, further comprising:
one of a cellular phone and a mobile computing device incorporating the central processing circuit.

10. A method of operating a central processing circuit, comprising:
supplying a plurality of memory devices of the central processing circuit with at least one of a memory core (MX) voltage or an application processor core (APC) voltage, wherein the plurality of memory devices includes a first group of memory devices and a second group of memory devices, and wherein the plurality of memory devices are grouped based on an access speed of each of the plurality of memory devices;
detecting an operating mode of the central processing circuit; and
switching a voltage supplied to at least one of the first group of memory devices or the second group of memory devices between the MX voltage and the APC voltage based on a type of the operating mode detected.

11. The method of claim 10, wherein the first group of memory devices includes memory devices that have an access speed of less than or equal to a timing threshold and the second group of memory devices includes memory devices that have an access speed of greater than the timing threshold.

12. The method of claim 10, wherein the first group of memory devices is switched from the MX voltage to the APC voltage when the operating mode is faster than a nominal operating mode.

13. The method of claim 10, wherein the second group of memory devices is switched from the MX voltage to the APC voltage when the operating mode is at least a turbo operating mode.

14. The method of claim 10, wherein:
the first group of memory devices is coupled to a first array power multiplexer (APM), the first APM configured to switch the voltage provided to the first group of memory devices between the MX voltage and the APC voltage, and
the second group of memory devices is coupled to a second array power multiplexer (APM), the second APM configured to switch the voltage provided to the second group of memory devices between the MX voltage and the APC voltage.

15. The method of claim 14, wherein:
the first APM is controlled by a first APM controller;
the second APM is controlled by a second APM controller; and
the first APM controller and the second APM controller are controlled by a dynamic clock and voltage scaling (DCVS) circuit.

16. The method of claim 15, wherein the DCVS circuit is configured to:
detect the operating mode; and
initiate the first APM controller to control the first APM to switch the voltage supplied to the first group of memory devices from the MX voltage to the APC voltage when the operating mode is faster than a nominal operating mode.

17. The method of claim 16, wherein the DCVS circuit is further configured to:
initiate the second APM controller to control the second APM to switch the voltage supplied to the second group of memory devices from the MX voltage to the APC voltage when the operating mode is at least a turbo operating mode.

18. The method of claim 10, wherein the central processing circuit is incorporated into one a cellular phone and a mobile computing device.

19. An apparatus for operating a central processing circuit, comprising:
means for supplying a plurality of memory devices with at least one of a memory core (MX) voltage or an application processor core (APC) voltage, wherein the plurality of memory devices includes a first group of memory devices and a second group of memory devices, and wherein the plurality of memory devices are grouped based on an access speed of each of the plurality of memory devices;
means for detecting an operating mode of the central processing circuit; and
means for switching a voltage supplied to at least one of the first group of memory devices or the second group of memory devices between the MX voltage and the APC voltage based on a type of the operating mode detected.

20. The apparatus of claim 19, wherein the first group of memory devices includes memory devices that have an access speed of less than or equal to a timing threshold and the second group of memory devices includes memory devices that have an access speed of greater than the timing threshold.

21. The apparatus of claim 19, wherein the means for switching is configured to switch the first group of memory devices from the MX voltage to the APC voltage when the operating mode is faster than a nominal operating mode.

22. The apparatus of claim 19, wherein the means for switching is configured to switch the second group of memory devices from the MX voltage to the APC voltage when the operating mode is at least a turbo operating mode.

23. The apparatus of claim 19, wherein the means for switching includes:
a first array power multiplexer (APM) means for switching the voltage provided to the first group of memory devices between the MX voltage and the APC voltage; and
a second APM means for switching the voltage provided to the second group of memory devices between the MX voltage and the APC voltage.

24. The apparatus of claim 23, wherein the means for switching includes:
a first APM controlling means for controlling the first APM means;
a second APM controlling means for controlling the second APM means; and a dynamic clock and voltage scaling (DCVS) means for controlling the first APM controlling means and the second APM controlling means.

25. The apparatus of claim 24, wherein the DCVS means is configured to:
   detect the operating mode; and
   initiate the first APM controlling means to control the first APM means to switch the voltage supplied to the first group of memory devices from the MX voltage to the APC voltage when the operating mode is faster than a nominal operating mode.

26. The apparatus of claim 25, wherein the DCVS means is further configured to:
   initiate the second APM controlling means to control the second APM means to switch the voltage supplied to the second group of memory devices from the MX voltage to the APC voltage when the operating mode is at least a turbo operating mode.

27. The apparatus of claim 19, further comprising:
   one of a cellular phone and a mobile computing device incorporating the central processing circuit.

\* \* \* \* \*